United States Patent [19]
Takemura et al.

[11] Patent Number: 5,576,221
[45] Date of Patent: Nov. 19, 1996

[54] MANUFACTURING METHOD OF SEMICONDUCTOR DEVICE

[75] Inventors: Hisashi Takemura; Tsutomu Tashiro, both of Tokyo, Japan

[73] Assignee: NEC Corporation, Tokyo, Japan

[21] Appl. No.: 358,455

[22] Filed: Dec. 19, 1994

[30] Foreign Application Priority Data

Dec. 20, 1993 [JP] Japan ..................... 5-319538

[51] Int. Cl.$^6$ .................... H01L 27/144; H01L 21/20
[52] U.S. Cl. ................... 437/2; 437/3; 437/106; 437/131
[58] Field of Search ................... 437/106, 131, 437/2, 3; 257/15, 19, 21

[56] References Cited

U.S. PATENT DOCUMENTS

| | | | |
|---|---|---|---|
| 4,771,013 | 9/1988 | Curran | 437/131 |
| 4,772,924 | 9/1988 | Bean et al. | 257/19 |
| 4,847,210 | 7/1989 | Hwang et al. | |
| 5,051,372 | 9/1991 | Sasaki | 437/3 |
| 5,266,813 | 11/1993 | Comfort et al. | 257/19 |
| 5,399,511 | 3/1995 | Taka et al. | 437/106 |

FOREIGN PATENT DOCUMENTS

| | | |
|---|---|---|
| 63-122285 | 5/1988 | Japan. |
| 3-53567 | 3/1991 | Japan. |
| 4-367282 | 12/1992 | Japan. |
| 6-085235 | 3/1994 | Japan. |
| WO89/12323 | 12/1989 | WIPO. |

OTHER PUBLICATIONS

Pearsall, T. P. et al., "Avalanche Gain in Ge$_x$Si$_{1-x}$/Si Infrared Waveguide Detectors", *1986 IEEE*, pp. 330–332.

*Primary Examiner*—Mary Wilczewski
*Attorney, Agent, or Firm*—Young & Thompson

[57] ABSTRACT

To selectively grow a P type silicon layer and a Si/Ge$_x$Si$_{1-x}$ superlattice layer under low temperature conditions in the area encircled with a groove, at least the side walls of which consist of silicon oxide film, which is formed in the silicon substrate. Thereby, the leak at the side of the superlattice layer can be reduced. Furthermore, by burying a metal film in the groove, the loss of light at the side of the superlattice layer can be suppressed to the minimum. Thus a light receiver having silicon/germanium silicon-mixed-crystal layer is stably formed in a silicon semiconductor substrate and optical absorption efficiency can be improved.

12 Claims, 7 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device having Si/GeSi superlattice structure selectively formed on the silicon substrate, which is useful as an optoeletric integrated circuit (OEIC) receiver.

2. Description of the Related Art

The first example of a prior art relative to a photodetector is, as shown in FIG. 1, made by the following method: on the $P^+$ silicon substrate 18, a Si/Ge$_x$Si$_{1-x}$ superlattice layer 7 having superlattice structure of alternate layer of approximately 30 Å of Ge$_{0.8}$Si$_{0.4}$ and approximately 290 Å of Si formed by MBE (molecular beam epitaxy) method to the total thickness of 6000 Å.

Next, on said Si/Ge$_x$Si$_{1-x}$ superlattice layer 7, a P type silicon layer 6 is formed by MBE method and on the silicon layer 6, an $N^+$ type silicon layer 19 is formed. Then, as shown in the FIG.1, the $N^+$ type silicon layer 19 is converted to a mesa shape by etching. A silicon oxide film 9 is deposited on the silicon layer 6 by CVD method and an opening 9a is made on the oxide film 9 by selectively removing a part of the silicon oxide film 9 above the silicon layer 19. Then, aluminum electrodes 11 are attached to the base and top faces of the substrate (IEEE ELECTRON DEVICE LETTERS VOL. EDL-7, No. 5, 1986 pp 330–332).

As the second example of a prior art, a manufacturing method of a superlattice element as shown in Japanese Provisional Publication (hereinafter referred as TOKKAI) HEI 3-53567 is explained in order of its process. As shown in FIG.2A, a 2 μm thick cladding layer 21 made of Al$_x$Ga$_{1-x}$As is formed on a GaAs substrate 20 by MBE method, and then, a superlattice layer 22 of 640 Å thickness consisting of 4 cycles of an 80 Å GaAs layer and an 80 Å Al$_x$Ga$_{1-x}$As is formed and a 1 μm thick upper cladding layer 23 made of Al$_x$Ga$_{1-x}$As is formed.

Next, as shown in FIG.2B, a ridge structure 2 μm wide and 12μm high is formed by using photolithographic technique and RIE technique. Then, a silicon oxide layer 24 is formed on the surface of the ridge by plasma CVD method.

Then, as shown in FIG.2C, while the surface where a silicon oxide layer 24 is formed and another GaAs wafer (not shown) are put together, heat treatment is performed under hydrogen atmosphere to have partially mixed crystallization take place in the superlattice layer 22 from the sides contacting silicon oxide layer 24 in transverse direction so as to have a superlattice structure retained in the central parts only of the ridge structure and a mixed crystal layer 25 on the both sides of the superlattice structure.

In this example of prior art, although the sides are protected by the ridge structure and with the silicon oxide layers 24, the side walls are made to a mixed crystal layer 25 so that any adverse effects due to damages on the treated surfaces can be avoided.

Another example of a combination of an OEIC receiver having a Ge$_{1-x}$Si$_x$ mixed crystal layer and a device is the one described in TOKKAI SHO 63-122285. A sectional view of the MOS type image sensor is shown in FIG.3. A buffer layer 26 which comprises gradient ratio of Si to Ge$_{0.85}$Si$_{0.15}$ mixed crystal in the direction of the thickness is formed on the Si substrate 1 by, for example, MBE method. Then, an N type Ge$_{0.85}$Si$_{0.15}$ layer 27 is formed by MBE method, a $P^+$ drain region 29 and a $P^+$ source region 30 are formed on the surface of the substrate 1, a silicon oxide film 28, a drain electrode 31 and a gate electrode 32 are formed and then an OEIC receiver element and a MOS type image sensor are simultaneously formed on the Si substrate.

There are, however, weak points in all said prior technologies, which will be explained below.

The photodetector in the first example is composed of a so-called superlattice structure with a multiple layer structure of Si layers and Ge$_{1-x}$Si$_x$ layers in order to enhance optical receiving efficiency.

Although this is an attempt to improve the efficiency covering the small optical absorption coefficient of silicon, there is a limitation in this attempt because it is difficult to make the thickness of the layers of the superlattice any more than 6000 Å due to a problem of crystallization. Therefore, in order to improve the optical receiving efficiency, it is necessary to minimize the loss at the end face of the regions other than the thickness of the light absorption layer. In this first example, the side walls of the Si/Ge$_{1-x}$Si$_x$ superlattice is either as they were cut out or in a structure covered with a silicon oxide film in a mesa structure. Therefore, it is difficult to improve the absorption efficiency because of the loss of the incident light from the transverse direction at the side walls of the above mentioned structure. Although this structure enables the distance for absorption to be adjusted by the transverse distance of the Si/Ge$_{1-x}$Si$_x$ superlattice when the incident angle of the light is transverse to the substrate, it is difficult to have the light precisely incident upon the Si/Ge$_{1-x}$Si$_x$ end face by fixing optical fiber which is the source of the incident light.

There are other disadvantages attending the first two examples of prior art discussed above. Namely, if the end face of the superlattice is etched to form a mesa structure, the end faces are apt to be damaged. Also there is a reliability problem due to the energy level in the oxide film which covers the superlattice layers. In the prior art, a method to protect the etching side by mixed crystallization from the end face is adopted in order to solve the problem. While this method can be applied to a GaAs substrate, it cannot be applied to a Si substrate, According to the third example prior art, of an element to receive incident light from the top surface is formed, which is combined with other elements. However, in this method, it is necessary to make the area of the light receiving part large in order to improve optical receiving efficiency. Also, because the Si/Ge$_x$Si$_{1-x}$ superlattice layer is formed on the entire face, combination with other elements is difficult and adoption of a Si device is impossible. Therefore, it is difficult to incorporate a large scale integrated circuit because the ratio of the area occupied by the light receiving region of the chip becomes large due to the large area of the light receiving element. Furthermore, as discussed before, because a Si/GeSi layer is formed on the entire face of the substrate, simultaneous formation of a bipolar device is difficult in the case of the third example of prior art.

SUMMARY OF THE INVENTION

The object of the present invention is to provide a manufacturing method for a semiconductor device whereby stable formation of a photodetector and improvement of the optical absorption efficiency can be accomplished.

A manufacturing method of a semiconductor device according to the present invention, comprises the steps of:

forming a first conductivity type silicon substrate, a second conductivity type buried layer and a second conductivity type silicon layer; forming a first groove whose side walls are covered with a silicon oxide film in said second conductivity type silicon layer; removing said second conductivity type silicon layer which is encircled with said groove down to the predetermined depth; selectively forming a first silicon layer of first conductivity type on said second conductivity type silicon layer or said second conductivity type buried layer which is exposed; forming a silicon/germanium.silicon-mixed-crystal layer through alternate growth of more than one or two times of a silicon layer and a germanium.silicon-mixed-crystal layer on said first silicon layer of first conductivity type; and forming a second silicon layer of first conductivity type on said silicon/germanium-.silicon-mixed-crystal layer.

According to the present invention, within a region on the Si substrate encircled with grooves, at least side walls of which are made of silicon oxide film, a $Si/Ge_xSi_{1-x}$ superlattice layer is formed by applying UHVCVD method which enables selective growth under low temperature conditions. Thus, the leak current component in the $Si/Ge_xSi_{1-x}$ superlattice due to etching of side walls and damage of the side walls caused by mesa growth and interfacial energy level etc., which have so far been an unsolved problem, can be suppressed. With this method of the present invention, it has now become possible to reduce the leak level from the conventional level around $10^{-6}A$ to less than $10^{-7}A$, a reduction of more than one order of magnitude.

Further, according to the present invention, a metal layer is formed so as to encircle the $Si/Ge_xSi_{1-x}$ superlattice and to prevent the light projected from optical fiber from being lost from the side walls of the $Si/Ge_xSi_{1-x}$ superlattice and making it possible to obtain higher light intensity than before by more than 20% by confining the light by reflection, thus it is possible to convert optical signals to electric signals more efficiently.

Also, according to the present invention, as for the placement of the optical fiber which is the incident source of the optical signals to the $Si/Ge_xSi_{1-x}$ superlattice, by placing the optical fiber in the groove made on the Si substrate in a way to make the height of the center of the optical fiber correspond to that of the $Si/Ge_xSi_{1-x}$ superlattice, it is possible to easily improve the precision of the alignment of the optical fiber, which has so far been an unsolved problem for the incident light from a transverse direction. Also, as another method, by utilizing reflection and refraction at the side of the V-shaped grooves formed transversely on the $Si/Ge_xSi_{1-x}$ superlattice, the signals from optical fibers can be input from either the top surface or the base of the chip.

Because of the above, although the conventional methods made it difficult to place the fiber from the side due to packaging reasons, it is now possible to place the fiber from either the top or base face, and furthermore, although the conventional methods required making the area of a photodetector large because the optical signals were entered directly to the $Si/Ge_xSi_{1-x}$ only from the top surface, the method of the present invention is effective to improve the freedom and efficiency of the layout because it makes it possible to introduce optical signals transversely to the $Si/Ge_xSi_{1-x}$ superlattice even if the optical signals are projected from the top.

The method of the present invention also makes it possible to form a photodetector with $Si/Ge_xSi_{1-x}$ superlattice selectively in the silicon substrate and also makes it possible to form it on the same chip as for other Si devices because a UHVCVD method can be applied at low temperature. Although the conventional technology allowed using limited devices such as CCD to form a photodetector in a common chip together with other elements, it did not allow a superlattice structure to be used. However, the present invention makes it possible to form such a structure on the same chip as for other Si devices, therefore, a photodetector can be formed on the same chip where other elements such as a vertical bipolar device have been formed prior to the formation of the photodetector. Thus, an element which required two chips with the conventional method can now be made with one chip. Furthermore, because of the possibility of the formation of an optical receiver at low temperature, it is now possible to make it one unit within an OEIC with high performance bipolar devices. Therefore, the method of the present invention not only makes it possible to make one package instead of two packages required by conventional methods, but also makes it possible to form a compact and high performance OEIC by simultaneously solving problems of loss and reduced speed due to connection between the packages.

DETAILED DESCRIPTION OF THE PREFERRED EMBODIMENTS

Figure 1:
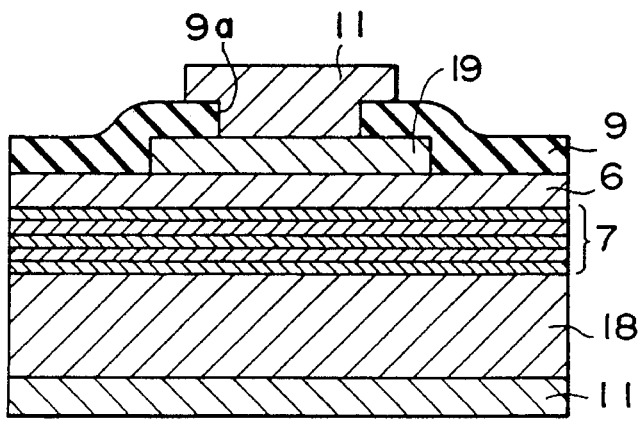
FIG.1 is a cross sectional view showing a first example of prior art.
Figure 2A:
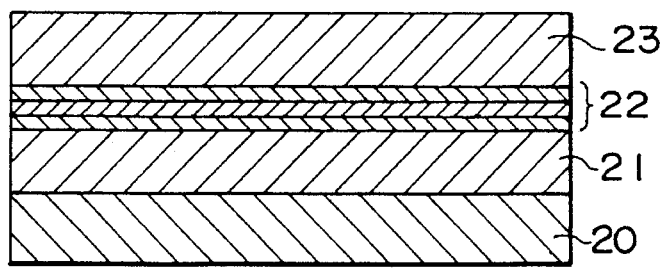
FIG.2A–2C are cross sectional views showing a prior art 2 of the another conventional method in order of the manufacturing process.
Figure 2B:
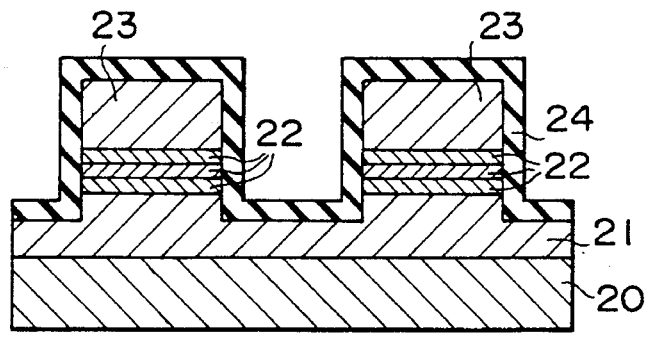
Figure 2C:
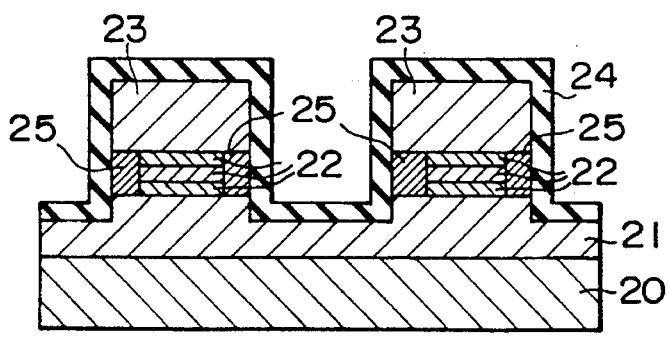
Figure 3:
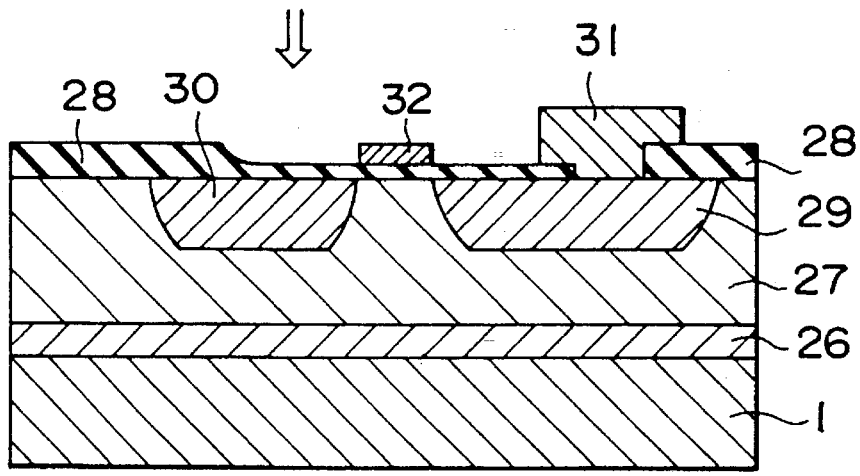
FIG.3 is a cross sectional view showing a prior art 3
Figure 4:
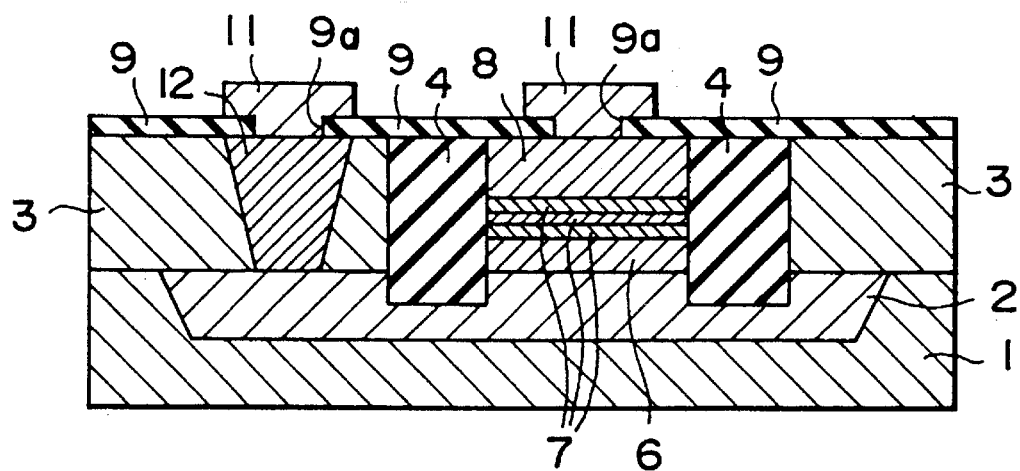
FIG.4 is a cross sectional view showing a first embodiment (embodiment 1) of the present invention.

The present invention will be further described referring drawings as follows;

FIG.4 is a cross sectional view of a semiconductor chip of the first embodiment (embodiment 1) of the present invention.

To make the chip, first, a buried layer 2 is formed by doping N type impurity atoms such as arsenic atoms in P type silicon substrate 1 at the concentration of $10^{19}$ $cm^{-3}$ to $10^{21}$ $cm^{-3}$.

An epitaxial layer 3, of 0.8 μm thickness for example, is formed on the substrate 1. Grooves 4 in which silicon oxide films are buried, are formed to the depth reaching the $N^+$buried layer 2. The epitaxial layer 3 is removed within the area between by the grooves 4.

In the area where the epitaxial layer 3 is removed, a P type silicon layer 6, which has been added with boron atoms at the concentration of $10^{16}$ cm$^{-3}$ to $10^{20}$ cm$^{-3}$, is formed to 2000 Å thick by epitaxial growth method. On the P type silicon layer 6, a Si/Ge$_x$Si$_{1-x}$ superlattice layer 7, is selectively formed to a total thickness of 1000 Å to 6000 Å by alternately growing, for example, 100 Å to 200 Å layers of silicon and 50 Å to 100 Å layers of Ge$_x$Si$_{1-x}$ by UHVCVD (Ultra High Vacuum CVD) method. On top of the Si/Ge$_x$Si$_{1-x}$ superlattice layer 7, a P$^+$ silicon layer 8, which has been added with boron atoms, is selectively grown. Openings 9a are formed on the silicon oxide film 9 which is formed on the surface of the silicon substrate 1 and aluminum electrodes 11 are formed. The N$^+$ buried layer 2 is connected; to aluminum electrodes via an N$^+$ diffused layer 12 which has been formed in the epitaxial layer 3. Preferably, the profile of the boron atom in the P type diffusion layer 6 is made at lower concentration at the bottom side where it contacts the N$^+$ buried layer 2 and at higher concentration such as $10^{19}$ cm$^{-3}$ to $10^{20}$ cm$^{-3}$ where it contacts the Si/Ge$_x$Si$_{1-x}$ superlattice layer 7 so that the electric field of the Si/Ge$_x$Si$_{1-x}$ superlattice layer 7 is lowered and leak current is reduced.

Figure 5:
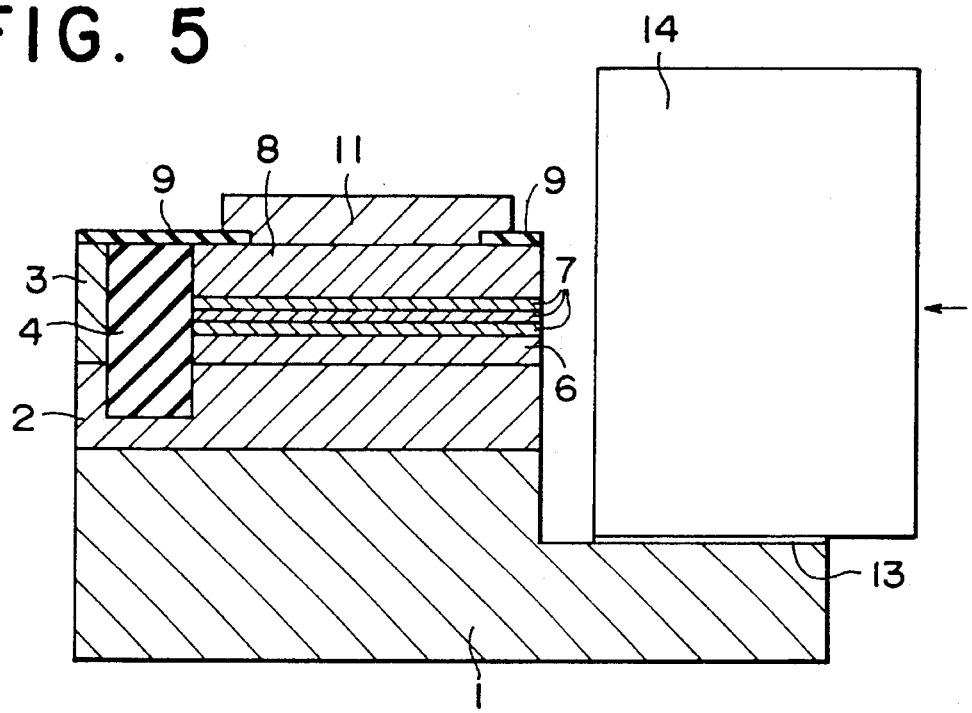
FIG.5 is another cross sectional view showing the embodiment 1 of the present invention viewed from a different angle.

FIG.5 is a cross sectional view of the optical receiver of the embodiment 1 of the present invention which is viewed from a different angle. If the diameter of the optical fiber 14, which is the light incident source of optical signals, is 20 µm, for example, this light receiver is selectively etched down to the depth of 10 µm at its terminal side where the light is entered through the P$^+$ type silicon layer 8, the Si/Ge$_x$Si$_{1-x}$ superlattice layer 7, the P type silicon layer 6, the N$^+$ buried layer 2 and the silicon substrate 1. The optical fiber 14 is adhered to the etched region using an adhesive such as polyimide and the center of the optical fiber is positioned to the center of the Si/Ge$_x$Si$_{1-x}$ layer, which acts as the light absorption layer. By so doing, the optical signals from the optical fiber 14 can enter into the Si/Ge$_x$Si$_{1-x}$ superlattice layer most efficiently and stably. Although in this embodiment of the present invention, only a structure whose terminal side of the Si/Ge$_x$Si$_{1-x}$ at the side toward the projected light is exposed is shown, the structure whose end face is covered with an insulation film such as oxide film after etching the groove for connection of the optical fiber is also preferred from the reliability stand-point.

Also, in this embodiment, only a case where the Si/Ge$_x$Si$_{1-x}$ superlattice layer 7 is etched is shown, but a method to form a groove for connection of the optical fiber by leaving the groove bounding the Si/Ge$_x$Si$_{1-x}$ superlattice layer 7 and by etching the epitaxial layer 3, the N$^+$ buried layer 2 and the silicon substrate 1 which are outside the groove can be applied to make the formation most reliable. The oxide film in the groove is not considered as a region of loss because the wave length of the optical fiber is within the infrared area. If the terminal end of the optical fiber is processed so as to better condense the incident light to the Si/Ge$_x$Si$_{1-x}$ superlattice layer 7, the efficiency can be further improved.

Figure 6:
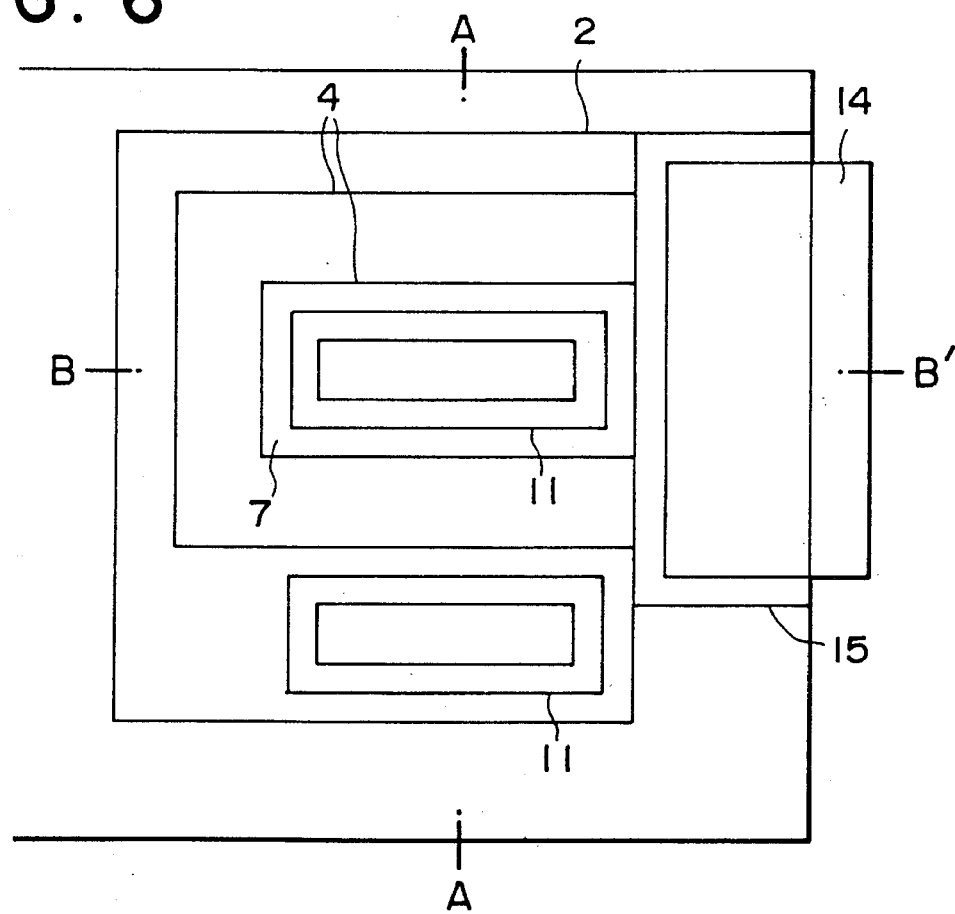
FIG.6 is a plan view showing the embodiment 1 of the present invention.

FIG.6 is a top view of the embodiment 1 of the present invention. The cross sectional view along the line A–A' corresponds to FIG.4 and the cross sectional view along the line B–B' to FIG.5. The Si/Ge$_x$Si$_{1-x}$ superlattice layer 7 is placed at the center of the second groove 4 for connection of the optical fiber so that the structure of the optical receiver including the optical fiber can be made most efficiently and precisely.

Next, a second embodiment (embodiment 2) of the present invention will be described FIG.7A–7F are cross sectional views of the embodiment 2 of the present invention in order of the manufacturing process.

Figure 7A:
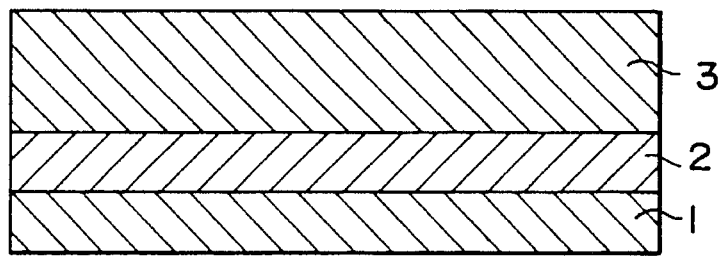
FIG.7A–7F are cross sectional views showing a second embodiment (embodiment 2) of the present invention in order of the manufacturing process.

First, as shown in FIG. 7A, arsenic atoms are added to a P type silicon substrate 1 by, for example, an ion implantation method, then an N$^+$ buried layer 2 is formed at the concentration of approximately $10^{19}$ cm$^{-3}$ to the depth of 2 µm and finally an epitaxial layer 3 is formed at the thickness of 0.5 µm to 1.5 µm by an epitaxial growth method.

Figure 7B:
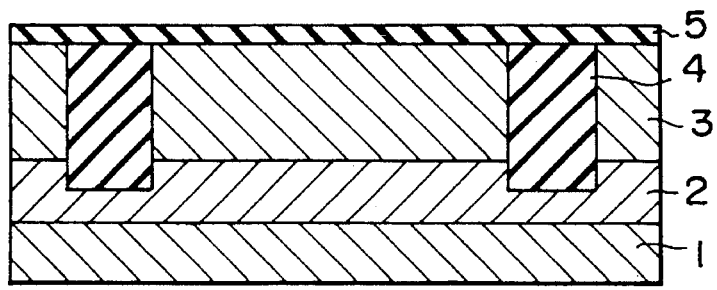

Next, as shown in FIG.7B, grooves 4 reaching the N$^+$ buried layer 2 are opened by an anisotropic etching method, a silicon oxide film or BPSG (boron phosphorus silicate glass) film is deposited by CVD method and embedding the grooves with the silicon oxide film or BPSG film by etching back and a 5000 Å thick silicon oxide film 5 is deposited by CVD method.

Figure 7C:
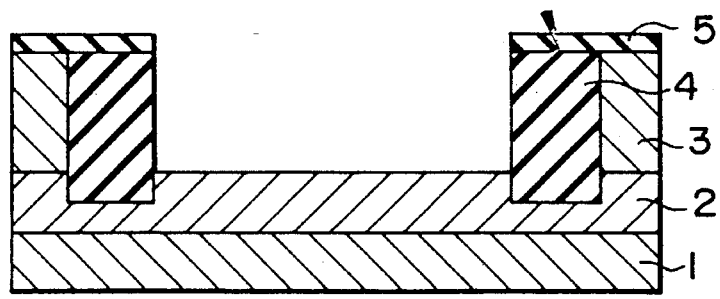

Next, as shown in FIG.7C, the silicon oxide film is selectively removed and the epitaxial layer is selectively removed by using silicon oxide film as a mask for etching.

Figure 7D:
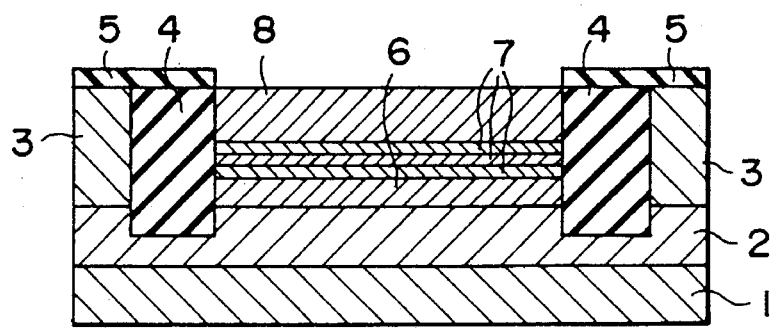

Next, as shown in FIG.7D, a P type silicon layer 6 is formed by having silicon selectively grow to a 2000 Å to 6000 Å thick with boron concentration of $10^{16}$ cm$^{-3}$ and further grown to 1000 Å thickness with $10^{19}$ cm$^{-3}$ of boron concentration.

Next, a Si/Ge$_x$Si$_{1-x}$ superlattice layer 7 is formed to 1000 Å to 6000 Å thick by alternately growing 100 Å to 200 Å thick Si and 50 Å to 100 Å thick Ge$_x$Si$_{1-x}$ layers. Then a P$^+$ type silicon layer 8 having $10^{19}$ cm$^{-3}$ to $10^{20}$ cm$^{-3}$ boron is grown.

Figure 7E:
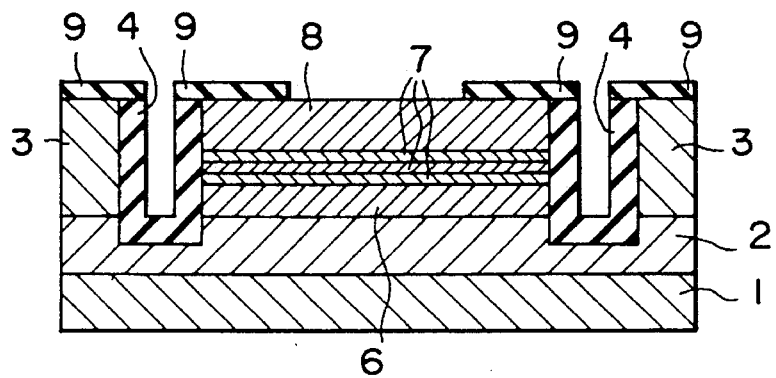

Next, after removing silicon oxide film 5, as shown FIG.7E, silicon oxide film 9 is formed at approximately 2000 Å thickness by a CVD method and grooves deeper than Si/Ge$_x$Si$_{1-x}$ layer 7 are opened in the silicon oxide film 9 and the grooves 4 by a photolithographic etching method. Further, an opening is made in the silicon oxide film 9 on top of the P$^+$ type silicon layer 8.

Figure 7F:
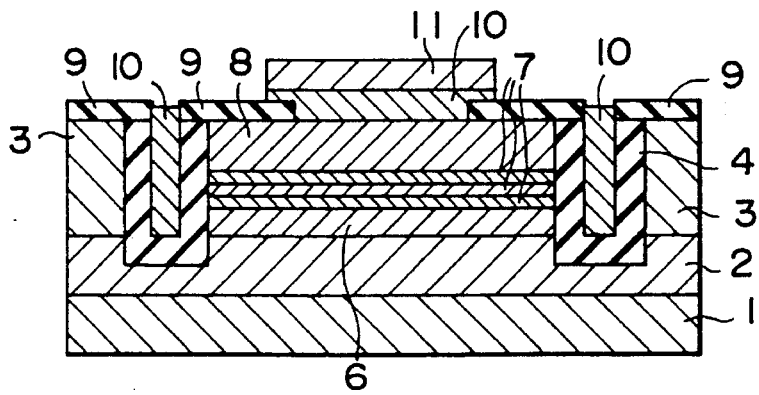

Next, as shown in FIG.7F, metal layers 10 made of a refractory metal such as tungsten film are deposited by a sputter method or a CVD method so as to fill up the grooves, aluminum is deposited by a sputter method to the thickness of 0.5 µm and an aluminum electrode 11 is formed by a photolithographic etching method. Then the metal layers 10 are etched at the same time as for aluminum electrode 11 so as to remain only in the grooves.

With this method, because a metal layer 10 which acts as a light reflecting layer in the grooves 4 encircling the light receiving layer which is Si/Ge$_x$Si$_{1-x}$ superlattice layer, the optical signals entered through the incident inlet are reflected by the metal layer 10 resulting in minimizing its loss from the side walls, thus enabling the efficiency to be further improved. Although the metal layer may be placed on the three side faces of the Si/Ge$_x$Si$_{1-x}$ superlattice layer 7, except the face toward the projection inlet, the effect is achieved even if it is placed at only one side face, either incident inlet or its opposite side.

Figure 8A:
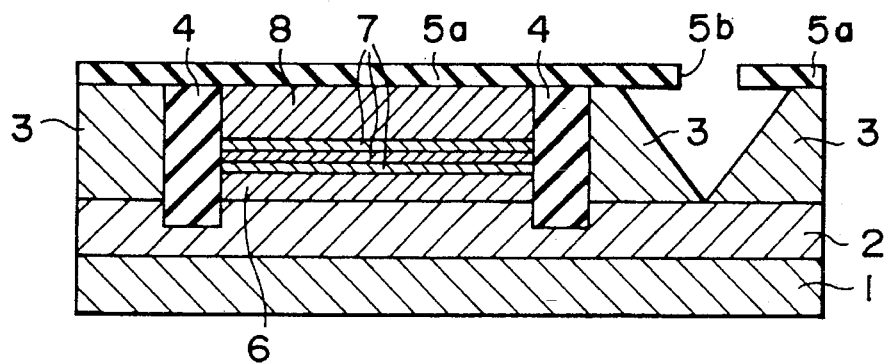
FIG.8A–8C are cross sectional views showing a third embodiment (embodiment 3) of the present invention in order of the manufacturing process.
Figure 8B:
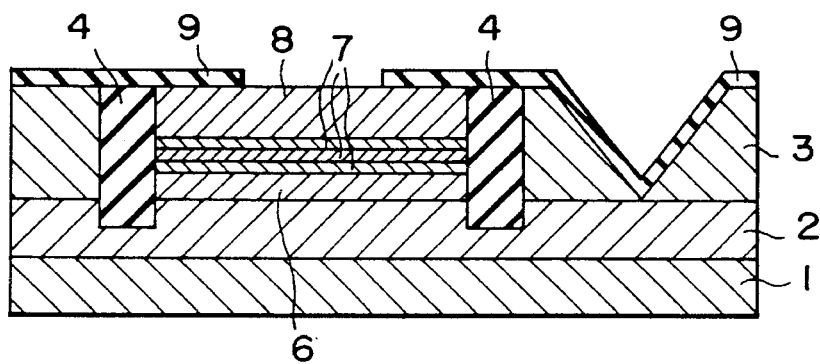
Figure 8C:
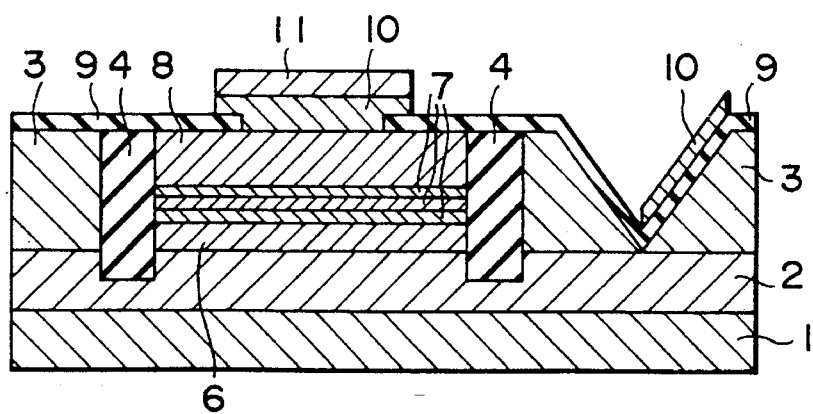

Next, a third embodiment (embodiment 3) of the present invention will be described as follows;

FIG.8A to 8C are cross sectional views of the embodiment 3 in order of the manufacturing process. Up to the process illustrated in FIG.7D, the same steps are applied. As shown in FIG.8A, an opening 5b is formed in a silicon oxide film 5a after removing the silicon oxide film 5 then the 2000 Å thick silicon oxide film 5a is formed by a CVD method.

Next, the epitaxial growth layer which is exposed in the opening 5b is etched by using alkaline solution such as KOH. With this method, a V shaped groove as shown in FIG.8A is obtained because the etching stops at the (111) face.

Next, as shown in FIG.8B, the silicon oxide film 9 is removed and a silicon oxide film 9 is newly formed by CVD method to the thickness of 2000 Å. Then an opening is made on the silicon oxide film 9 so that it goes through to the P⁺ type silicon layer 8.

Next, as shown in FIG.8C, a metal layer 10 is formed, aluminum is formed by a sputter method and an aluminum electrode 11 is formed by a photolithographic etching method. When the aluminum is etched, the metal 10 is formed at the lower layer and the metal layer 10 is selectively etched by a photolithographic etching method.

With this method, because the optical signals from the optical fiber can be entered from the top surface of the chip, the fiber can be placed easily. In this embodiment, only the method where the incident light is entered from the top surface of the chip is described.

However, it is also possible to have the incident light from the bottom surface of the chip by placing the metal layer 10 on the side of the V shaped groove closer to the Si/Ge$_x$Si$_{1-x}$ superlattice layer.

Figure 9:
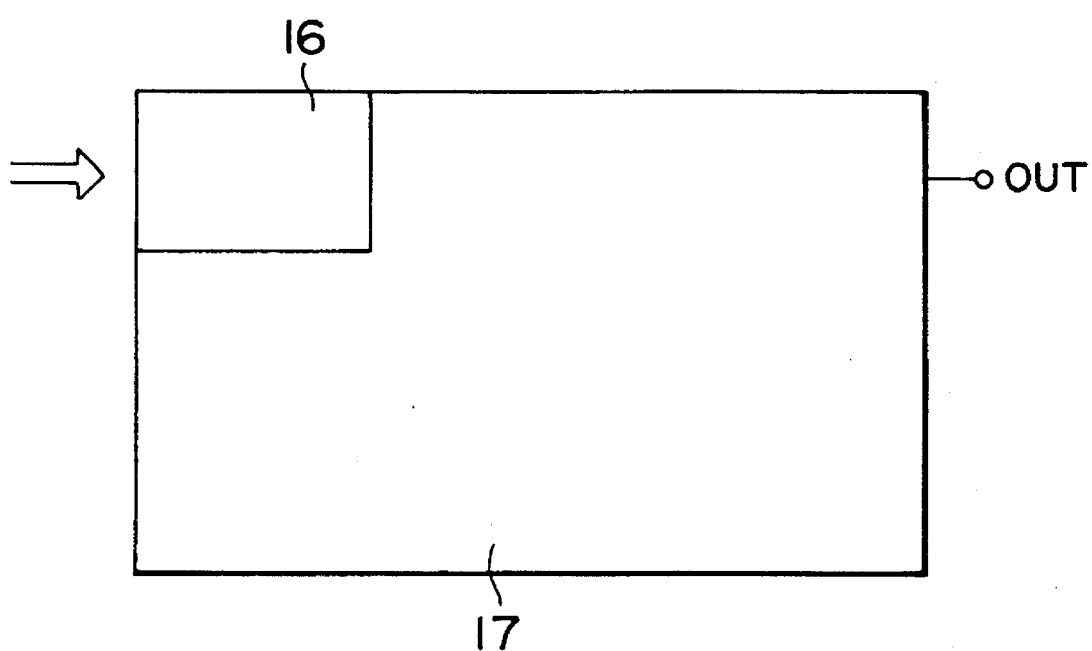
FIG.9 is a diagram showing a fourth embodiment (embodiment 4) of the present invention illustrating the formation of the circuit.

Next, a fourth embodiment (embodiment 4) of the present invention will be described as follows;

FIG.9 shows the embodiment 4 of the present invention which is applied to an OEIC 17. As shown in FIG.9, the structure includes the Si/Ge$_x$Si$_{1-x}$ superlattice layer formed in silicon as a photodetector 16 which is described in a part of a chip of an OEIC working as an analog to digital converter.

In this embodiment, first, as shown in FIG.7A, after forming an N⁺ buried layer 2 and an epitaxial growth layer 3 on the silicon substrate 1, a bipolar transistor is formed by a known method up to the stage before a contact for an electrode is formed. Then, by performing processes after those described in FIG.7B, a photodetector 16 is formed and by forming electrodes at the photo-detector 16 and the bipolar transistor, an optical receiver circuit can be formed. Thus, according to the present invention, because the Si/Ge$_x$Si$_{1-x}$ superlattice layer is formed in the Si substrate under the growth conditions of less than 700° C., a potential change in the profile of the bipolar area can be minimized and it is possible to form a chip which contains a high performance bipolar element.

Although the embodiments of the present invention mentioned here are related to the ones where a P/N junction is formed on the lower surface of the Si/Ge$_x$Si$_{1-x}$ superlattice layer, it can be on the top face.

What is claimed is:

1. A manufacturing method of a semiconductor device comprising the steps of;

forming on a first conductivity type silicon substrate, a second conductivity type buried layer and a second conductivity type silicon layer;

forming a first groove whose side walls are covered with a silicon oxide film in said second conductivity type silicon layer;

removing said second conductivity type silicon layer which is bounded by said groove down to predetermined depth;

selectively forming a first silicon layer of first conductivity type on said second conductivity type silicon layer or said second conductivity type buried layer which is exposed;

forming a Si/Ge$_x$Si$_{1-x}$ layer through alternate growth of a silicon layer and a Ge$_x$Si$_{1-x}$ layer on said first silicon layer of first conductivity type; and forming a second silicon layer of first conductivity type on said Si/Ge$_x$Si$_{1-x}$ layer.

2. The manufacturing method of a semiconductor device according to claim 1, further comprising the steps of:

forming an opening which is formed deeper than said Si/Ge$_x$Si$_{1-x}$ layer and on at least one of the directions toward the side walls of said Si/Ge$_x$Si$_{1-x}$ layer; and burying a metal layer in said opening.

3. The manufacturing method of a semiconductor device according to claim 2 further comprising the steps of;

forming a second groove in the silicon substrate located transversely adjacent to said Si/Ge$_x$Si$_{1-x}$ layer to a depth of ½ of the diameter of an optical fiber; and fixing the optical fiber in said groove.

4. The manufacturing method of a semiconductor device according to claim 3, further comprising the steps of:

fixing said optical fiber in a way that its center line is aligned with said Si/Ge$_x$Si$_{1-x}$ layer.

5. The manufacturing method of a semiconductor device according to claim 1, wherein said Si/Ge$_x$Si$_{1-x}$ layer grows selectively at temperatures less than 800° C.

6. The manufacturing method of a semiconductor device according to claim 1 further comprising the steps of;

forming a second groove in the silicon substrate located transversely adjacent to said Si/Ge$_x$Si$_{1-x}$ layer to a depth of ½ of the diameter of an optical fiber; and fixing the optical fiber in said groove.

7. The manufacturing method of semiconductor device according to claim 6, further comprising the steps of:

fixing said optical fiber in a way that its center line is aligned with said Si/Ge$_x$Si$_{1-x}$ layer.

8. The manufacturing method of a semiconductor device according to claim 6, wherein said Si/Ge$_x$Si$_{1-x}$ layer grows selectively at temperatures less than 800° C.

9. The manufacturing method of a semiconductor device according to claim 1, further comprising the steps of:

forming a V shaped groove in the silicon substrate located transversely adjacent to said Si/Ge$_x$Si$_{1-x}$ layer; and fixing an optical fiber with its outlet end directed toward said V shaped groove.

10. The manufacturing method of a semiconductor device according to claim 2, further comprising the steps of:

forming a V shaped groove in the silicon substrate located transversely adjacent to said Si/Ge$_x$Si$_{1-x}$ layer; and fixing an optical fiber with its outlet end directed toward said V shaped groove.

11. A manufacturing method of a semiconductor device comprising the steps of:

forming a semiconductor device for an analog digital signal converter comprising a bipolar type transistor in a silicon substrate; and subsequently forming an Si/Ge$_x$Si$_{1-x}$ layer as an optical receiver, through alternative growth of a silicon layer and a Ge$_x$Si$_{1-3}$ layer on only selected regions of said silicon substrate; wherein said step of forming said Si/Ge$_x$Si$_{1-x}$ layer comprises the steps of:

forming on a first conductivity type silicon substrate, a second conductivity type buried layer and a second conductivity type silicon layer;

forming a first groove whose side walls are covered with a silicon oxide film in said second conductivity type silicon layer said first groove encircling an area of said second conductivity type silicon layer;

removing said second conductivity type silicon layer within the area encircled with said first groove to a predetermined depth;

selectively forming a first silicon layer of first conductivity type on said second conductivity type silicon layer or said second conductivity type buried layer which is exposed;

forming $Si/Ge_xSi_{1-x}$ layer formed through alternate growth of a silicon layer and a $Ge_xSi_{1-x}$ layer on said first silicon layer of first conductivity type; and forming a second silicon layer of first conductivity type on said $Si/Ge_xSi_{1-x}$ layer.

12. The manufacturing method of a semiconductor device according to claim 11, wherein said $Si/Ge_xSi_{1-x}$ layer grows selectively at temperatures less than 800° C.

* * * * *